(12) United States Patent
Majhi et al.

(10) Patent No.: US 10,854,746 B2
(45) Date of Patent: Dec. 1, 2020

(54) CHANNEL CONDUCTIVITY IN MEMORY STRUCTURES

(71) Applicant: Intel Corporation, Santa Clara, CA (US)

(72) Inventors: Prashant Majhi, San Jose, CA (US); Khaled Hasnat, San Jose, CA (US); Krishna Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/190,135

(22) Filed: Nov. 13, 2018

(65) Prior Publication Data
US 2020/0152793 A1 May 14, 2020

(51) Int. Cl.
H01L 29/792 (2006.01)
H01L 29/78 (2006.01)
H01L 27/11524 (2017.01)
H01L 27/11556 (2017.01)
H01L 29/04 (2006.01)
H01L 27/11582 (2017.01)
H01L 29/16 (2006.01)
H01L 27/1157 (2017.01)
H01L 21/28 (2006.01)

(52) U.S. Cl.
CPC ...... H01L 29/7843 (2013.01); H01L 27/1157 (2013.01); H01L 27/11524 (2013.01); H01L 27/11556 (2013.01); H01L 27/11582 (2013.01); H01L 29/04 (2013.01); H01L 29/16 (2013.01); H01L 29/40114 (2019.08); H01L 29/40117 (2019.08)

(58) Field of Classification Search
CPC ......... H01L 27/11524; H01L 27/11556; H01L 29/40114; H01L 29/40117
USPC .......................................... 257/66, 321, 324
See application file for complete search history.

(56) References Cited

U.S. PATENT DOCUMENTS

| 7,442,989 | B2 * | 10/2008 | Kobayashi | B82Y 10/00 257/320 |
| 8,932,915 | B2 * | 1/2015 | Saitoh | B82Y 10/00 438/151 |
| 10,418,378 | B2 * | 9/2019 | Fukuzumi | H01L 27/11578 |
| 2019/0067306 | A1 * | 2/2019 | Fang | H01L 21/76829 |
| 2019/0198509 | A1 * | 6/2019 | Kim | H01L 27/1157 |

OTHER PUBLICATIONS

Chen et al.; "Multicolor Polymer Disperse Microencapsulated Liquid Crystal Displays;" Journal of Display Technology; (Jun. 2009); pp. 184-187; vol. 5, No. 6; <doi: 10.1109/JDT.2009.2013485 >.
Sugii; "High-Performance Bulk CMOS Technology for 65/45 nm Nodes;" Solid-State Electronics; (Jan. 2006); pp. 2-9; vol. 50, Issue 1; <doi: 10.1016/j.sse.2005.10.047 >.

* cited by examiner

Primary Examiner — Tan N Tran
(74) Attorney, Agent, or Firm — Compass IP Law PC

(57) ABSTRACT

A memory structure can include a conductive channel, a charge storage structure adjacent to the conductive channel, and a strain-inducing layer adjacent to the conductive channel on a side opposite the charge storage structure. The strain-inducing layer can have a higher coefficient of thermal expansion (CTE) than the conductive channel.

21 Claims, 8 Drawing Sheets

CHANNEL CONDUCTIVITY IN MEMORY STRUCTURES

BACKGROUND

Memory structures are integrated circuits that provide data storage to a variety of electronics devices. Memory types can include volatile memory structures that lose stored information when not powered (e.g., RAM-Random Access Memory), and non-volatile memory structures that retain stored information even when not powered. Examples of non-volatile memory include flash memory (e.g. NOR, NAND, and charge trap/replacement gate) as well as phase change memory (PCM).

Most non-volatile memory devices have architecture that electrically couples a source line to an array of memory cells. For example, memory cells in flash memory arrays are arranged such that a control gate of each memory cell in a row of the array is connected to form an access line, such as a word line. Columns of the array include strings of memory cells connected source to drain, between a pair of select lines, a source select line and a drain select line.

Flash memory arrays may be in two-dimensional configurations or three-dimensional (3D) configurations (e.g., stacked memory arrays including pillars of stacked memory elements, such as vertical NAND strings). The source select line includes a source select gate at each intersection between a memory cell string and the source select line, and the drain select line includes a drain select gate at each intersection between a memory cell string and the drain select line. Each source select gate is connected to a source line, while each drain select gate is connected to a data line, such as a column bit line. Typically, the source line and the data line are formed of polysilicon and the memory cells are connected via a polysilicon channel, which is electrically coupled to the source and data lines.

DESCRIPTION OF EMBODIMENTS

Figure 1A:
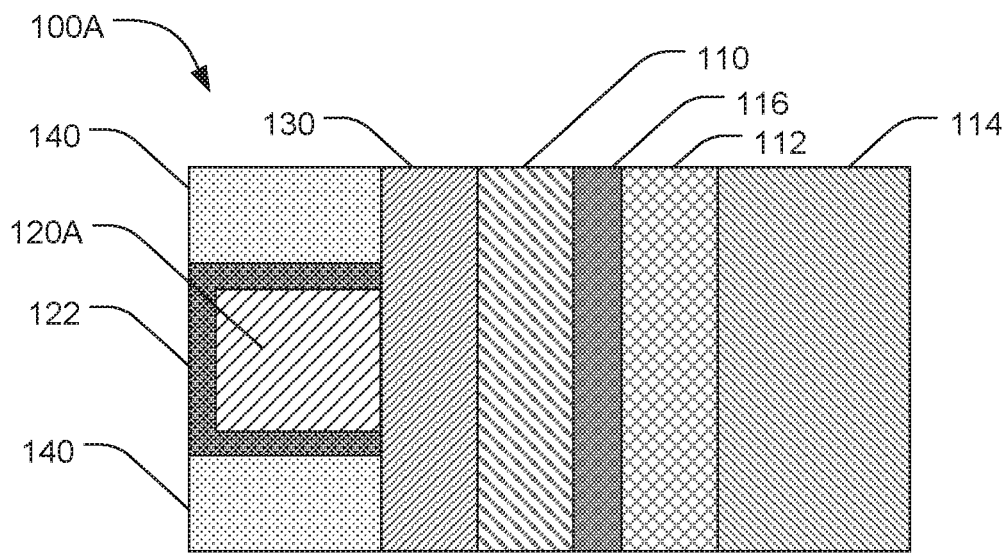
FIG. 1A illustrates a memory structure, in accordance with an example embodiment.

Although the following detailed description contains many specifics for the purpose of illustration, a person of ordinary skill in the art will appreciate that many variations and alterations to the following details can be made and are considered to be included herein. Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise and vice versa. Thus, for example, reference to "a memory cell" includes a plurality of such memory cells and reference to "bit lines" includes a single bit line.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open-ended term, like "comprising" or "including," in this written description it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

Occurrences of the phrase "in one embodiment," or "in one aspect," herein do not necessarily all refer to the same embodiment or aspect.

The term "coupled," as used herein, is defined as directly or indirectly connected in an electrical or nonelectrical manner. "Directly coupled" objects or elements are in physical contact with one another and are attached. Objects described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 angstroms to about 80 angstroms" should also be understood to provide support for the range of "50 angstroms to 80 angstroms." Furthermore, it is to be understood that in this specification support for actual numerical values is provided even when the term "about" is used therewith. For example, the recitation of "about" 30 should be construed as not only providing support for values a little above and a little below 30, but also for the actual numerical value of 30 as well.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific embodiments are then described in further detail. This initial summary is intended to aid readers in understanding the technological concepts more quickly, but is not intended to identify key or essential features thereof, nor is it intended to limit the scope of the claimed subject matter.

In three-dimensional (3D) flash memory technology, the conductance of the conductive channel (e.g. the conductive pillar) can impact product performance. As the conductive channel is often deposited on a non-templated surface using backend processes, the final conductive channel can have medium to low mobility of channel carriers and corresponding low conductivity. In some cases, the mobility of channel carriers can be improved by increasing grain size or using higher mobility materials, such as SiGe, Ge, and III-V polycrystalline films. However, thermal treatment methods to increase the grain size are typically associated with increased integration complexity. Further, using higher mobility materials can result in poor gate oxide/channel interface properties.

Accordingly, the present disclosure describes memory structures, memory devices, computing systems, and associated methods that can help address the challenges described above and improve the electrical conductivity of the conductive channel. It is noted that when discussing the memory structures, memory devices, computing systems, and associated methods herein, each of these discussions can be considered applicable to one another whether or not they are explicitly discussed in the context of that example. Thus, for example, when discussing a pillar for use in a memory structure, such disclosure is also relevant to and directly supported in the context of memory devices, computing systems, and associated methods, vice versa, etc.

In one embodiment, a pillar for use in a memory structure can include a conductive channel and a strain-inducing layer adjacent to the conductive channel. In some examples, the pillar can also include an insulating material core interior to the conductive channel. Where this is the case, the strain inducing layer can be positioned between the insulating material core and the conductive channel. The strain-inducing layer can be configured to induce a tensile strain on the conductive channel. There are a variety of ways in which this can be accomplished. For example, in some cases, the strain-inducing layer can have a higher coefficient of thermal expansion (CTE) than the conductive channel. This can allow the strain-inducing layer to induce a tensile strain on the conductive channel rather than a compressive strain. In some additional examples, the strain-inducing layer can have a lattice mismatch relative to the conductive channel that induces a tensile strain on the conductive channel. The tensile strain on the conductive channel can increase the mobility of channel carriers through the conductive channel, thus increasing the conductivity (e.g. electrical conductivity) of the conductive channel. In contrast, a compressive strain can decrease the mobility of channel carriers through the conductive channel, thus decreasing the conductivity of the conductive channel. As such, the strain-inducing layer can be configured to induce a tensile strain on the conductive channel. In some specific examples, the strain-inducing layer can increase the mobility of channel carriers by up to 5% or more. In other examples, the strain-inducing layer can increase the mobility of channel carriers by up to 10% or more. In still other examples, the strain-inducing layer can increase the mobility of channel carriers by up to 15%, 20%, or more.

With this in mind, the memory structures disclosed herein can include a pillar having increased mobility of channel carriers and corresponding increased conductivity. More specifically, memory structures can include a conductive channel, a charge storage structure adjacent to the conductive channel, and a strain-inducing layer adjacent to the conductive channel on a side opposite the charge storage structure. Again, the strain-inducing layer can have a higher CTE than the conductive channel so as to induce a tensile strain on the conductive channel rather than a compressive strain.

Figure 1B:
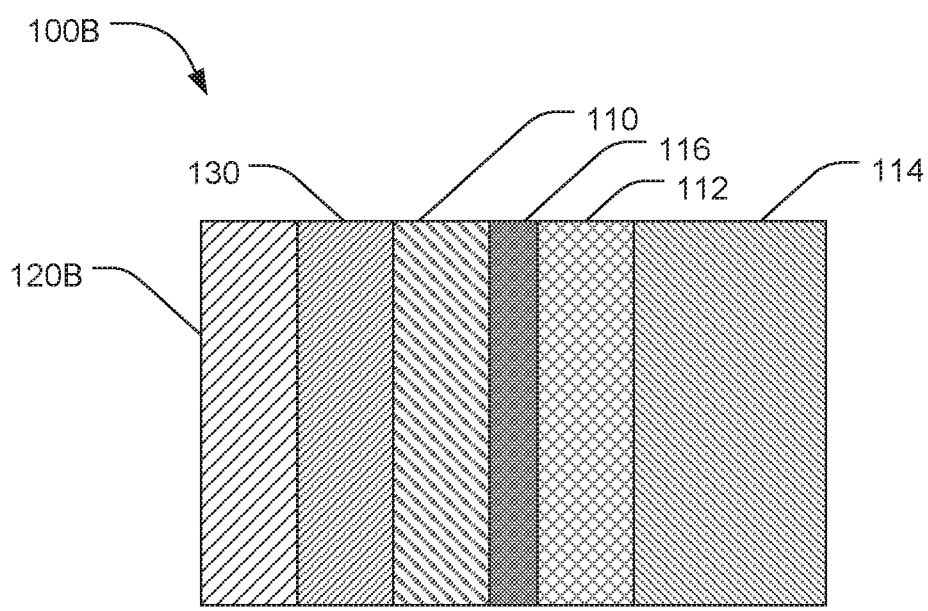
FIG. 1B illustrates a memory structure, in accordance with an example embodiment.

Non-limiting examples of memory structures are illustrated in FIGS. 1A-1B. Specifically, FIG. 1A illustrates a flash memory structure 100A including a floating gate charge storage structure 120A. A conductive channel 110 can be positioned adjacent to the charge storage structure 120A. A strain-inducing layer 112 can be positioned adjacent to the conductive channel 110 on a side opposite the charge storage structure 120A. An oxide layer 116, when included, can be positioned between the strain-inducing layer 112 and the conductive channel 110. An insulating material core 114 can be positioned interior to the conductive channel 110 and the strain-inducing layer 112 can be positioned between the conductive channel 110 and the insulating material core 114. A tunnel dielectric layer 130 can be positioned between the conductive channel 110 and the charge storage structure 120A. Additionally, the charge storage structure 120A can be positioned between dielectric layers 140 and bordered on at least three sides by a blocking layer (or inter-poly dielectric (IPD) layer) 122.

In further detail, the floating gate charge storage structure 120A can include a variety of suitable materials. The floating gate generally includes a conductive material that serves as a charge storage element for electrical charge. This charge storage element defines the memory state of the particular transistor with which it is associated. The floating gate is electrically isolated from surrounding conductive materials, and thus charge stored therein remains even when power to the device is discontinued. Any material that is suitable in preparing a floating gate charge storage structure can be employed. In one specific example, the floating gate charge storage structure can include doped or undoped polysilicon.

The blocking layer 122 can also include a variety of materials and can generally include any material that is suitable to electrically isolate the floating gate charge storage structure from surrounding conductive materials. As one specific example, the blocking layer can include a plurality of dielectric material layers, such as an oxide-nitride-oxide (ONO) layer, or other suitable multi-layer blocking layer or barrier.

The dielectric layers 140 can include a variety of dielectric materials and can generally include any materials suitable to electrically isolate the floating gate charge storage structure from surrounding conductive materials. Non-limiting examples can include silicon oxide, silicon nitride, silicon oxynitride, silicon carbide, undoped silicon, the like, or a combination thereof.

The tunnel dielectric layer 130 can also include a variety of suitable materials and can generally include any suitable tunnel dielectric material. Non-limiting examples can include oxides and nitrides such as $SiO_2$, SiON, the like, or a combination thereof.

The conductive channel 110 can include any suitable conductor or semiconductor material, which can include a single material or multiple different materials (e.g. composite materials). Non-limiting examples can include silicon, polysilicon, gallium, gallium arsenide, and the like, including combinations thereof. In some embodiments, the conductive channel can include a semiconductor material. In other embodiments, the semiconductor material can also be doped, such as P-type doped, or N-type doped. In some embodiments, the conductive channel can include a conductive metal, metal mixture, metal alloy, or the like. In one specific example, the conductive channel can include or otherwise be formed of doped or undoped polysilicon.

The strain-inducing layer 112 can include a variety of suitable materials. Generally, the strain-inducing layer can be formed of material that does not create interface defects with the conductive channel and that is not challenging to etch out during fabrication. Further, the strain inducing layer can typically have a thickness of from about 5 nanometers (nm) to about 20 nm. It is further noted that the strain induced on the conductive channel 110 by the strain-inducing layer can be measured using microscopic techniques, such as TEM, in combination with nano-diffraction techniques, for example. Other suitable analytical methodologies may also be employed.

In one specific example, the strain inducing material can include a dielectric material that has a higher CTE than the conductive channel. In some specific examples, the strain-inducing layer can include silicon nitride, a doped/alloyed silicon nitride, doped silicon, the like, or a combination thereof. For example, in some cases, the strain-inducing layer can be formed of or include $Si_xN_{1-x}$ where x is from about 0.3 to about 0.7. In some additional examples, the strain-inducing layer can be doped/alloyed with carbon, oxygen, the like, or a combination thereof. Typically, dopants can be present in an amount of from about 1 wt % to about 25 wt %. In some specific examples, carbon can be present in the strain-inducing layer in an amount from about 1 wt % to about 5 wt %. In still additional examples, oxygen can be present in the strain-inducing layer in an amount from about 5 wt % to about 20 wt %. In some additional examples, the strain-inducing layer can be formed of or include a material including silicon, nitrogen, oxygen, and/or carbon and that is configured to induce a tensile strain on the conductive channel. In some specific examples, the strain-inducing layer can have a coefficient of thermal expansion (CTE) of from about $0.5 \times 10^{-6}$/° C. to about $4.0 \times 10^{-6}$/° C. In some additional examples, the strain-inducing layer can have a CTE of from about $1.0 \times 10^{-6}$/° C. to about $3.5 \times 10^{-6}$/° C. In still additional examples, the strain-inducing layer can have a CTE of from about $2.0 \times 10^{-6}$/° C. to about $3 \times 10^{-6}$/° C. In some further examples, the CTE of the strain-inducing layer can be at least $0.5 \times 10^{-6}$/° C. higher than the CTE of the conductive channel. In other examples, the CTE of the strain-inducing layer can be at least $1.0 \times 10^{-6}$/° C. higher than the CTE of the conductive channel.

In other examples, the strain-inducing layer can be formed of a material having a higher lattice constant than the material of the conductive channel. Thus, a variety of strain-inducing materials having a higher lattice constant than the conductive channel material can be employed. For example, where the conductive channel is formed of polysilicon, one non-limiting example of a material having a higher lattice constant is SiGe, such as $SiGe_y$ where y is from about 0.2 to about 0.6. Numerous other materials can also be employed that also meet the criteria described herein. Suitable materials having a higher lattice constant than the material of the conductive channel can induce a high level of bi-axial tensile stress on the conductive channel when integrated with lattice registry between the strain-inducing layer and the conductive channel.

In some specific examples, an oxide layer 116 can be positioned between the strain-inducing layer and the conductive channel. The oxide layer can be an adhesion layer or can otherwise facilitate interfacing (e.g. to provide a low defect density interface) of the strain-inducing layer with the conductive channel. A variety of suitable oxide materials can be used to form the oxide layer. In one specific example, the oxide layer can be silicon oxide. In some additional specific examples, the oxide layer can have a thickness of from about 0.5 nm to about 1.5 nm.

The insulating material core 114 can include a variety of suitable dielectric materials. However, the insulating material core 114 can typically include a dielectric material that is distinct from the dielectric material of the strain-inducing layer. In some specific examples, the insulating material core can include silicon oxide, silicon oxynitride, silicon oxycarbide, spin-on-glass, organic polymer, organic/inorganic copolymer, the like, or other combination thereof. In some specific examples, the insulating material core and the strain-inducing layer can include different dielectric materials.

As an alternative embodiment, FIG. 1B illustrates a flash memory structure 100B including a charge trap (or replacement gate) charge storage structure 120B. A conductive channel 110 can be positioned adjacent to the charge storage structure 120B. A strain-inducing layer 112 can be positioned adjacent to the conductive channel 110 on a side opposite the charge storage structure 120B. An oxide layer 116, when included, can be positioned between the strain-inducing layer 112 and the conductive channel 110. An insulating material core 114 can be positioned interior to the conductive channel 110 and the strain-inducing layer 112 can be positioned between the conductive channel 110 and the insulating material core 114. A tunnel dielectric layer 130 can be positioned between the conductive channel 110 and the charge storage structure 120B.

The charge trap charge storage structure 120B can include a variety of suitable materials. Generally, the charge trap charge storage structure can include any dielectric materials that are suitable as a trapping layer. The charge trap charge storage element defines the memory state of the particular transistor with which it is associated. The charge trap is electrically isolated from surrounding conductive materials, and thus charge stored therein remains even when power to the device is discontinued. In some specific examples, the charge trap charge storage structure can include silicon nitride (e.g. $Si_3N_4$, for example). The tunnel dielectric 130, the conductive channel 110, the oxide layer 116, the strain-inducing layer 112, and the insulating core material 114 illustrated in FIG. 1B can generally include the same materials and features as described with respect to FIG. 1A.

Figure 2A:
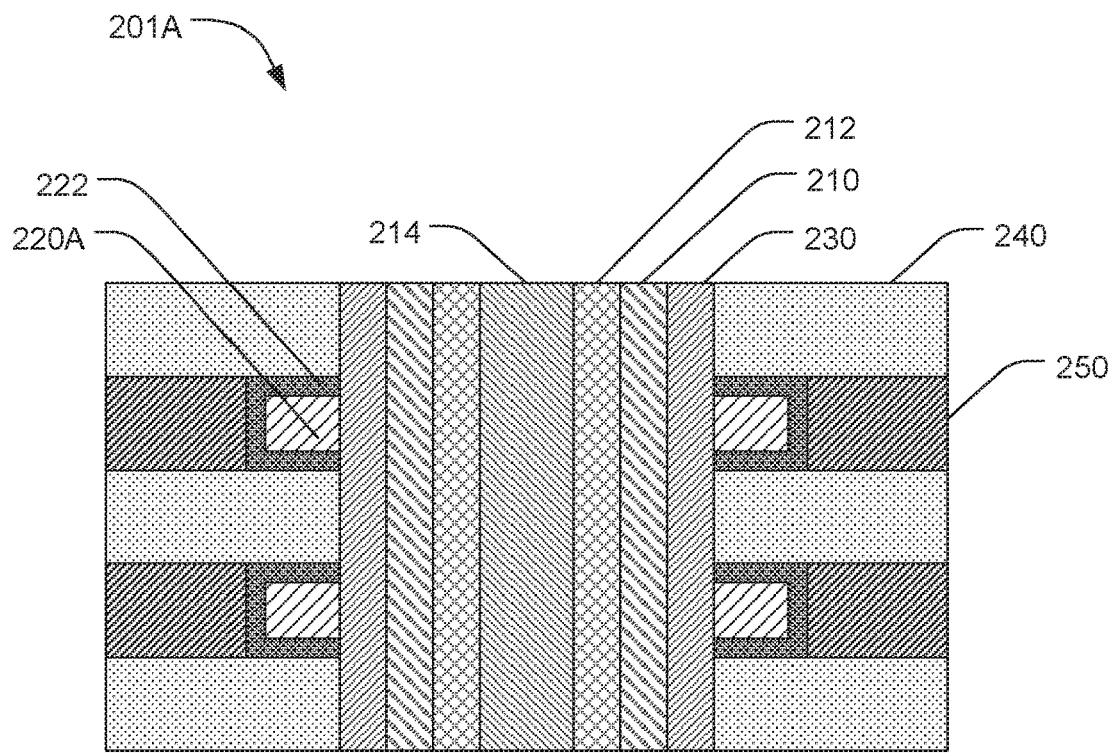
FIG. 2A illustrates a memory device, in accordance with an example embodiment.
Figure 2B:
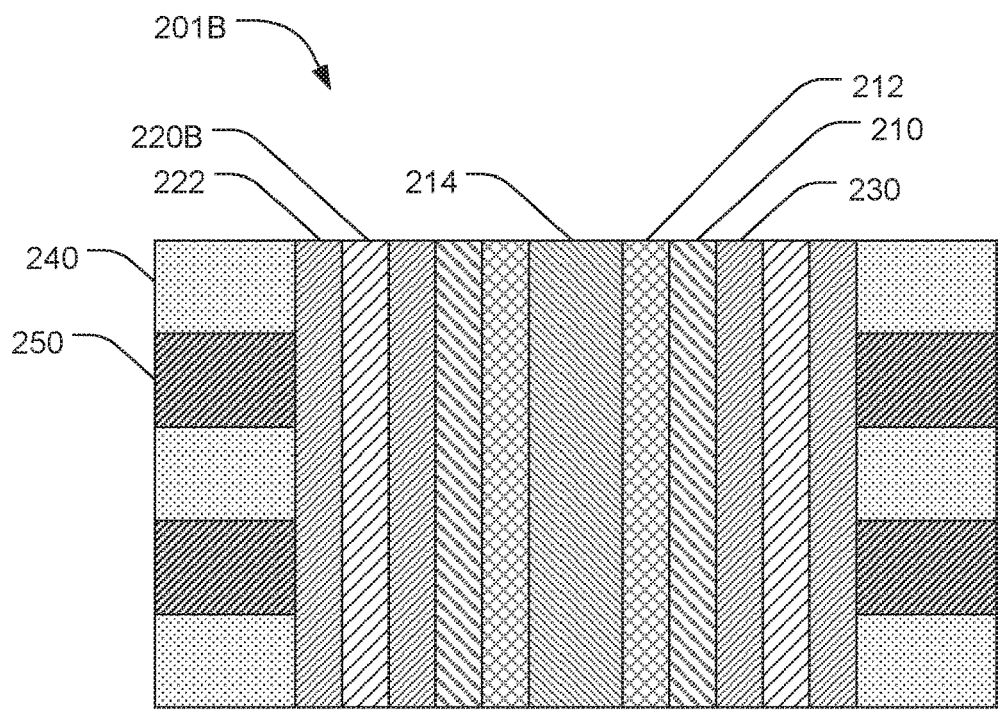
FIG. 2B illustrates a memory device, in accordance with an example embodiment.

The memory structures disclosed herein can be included in a variety of memory devices. Non-limiting examples of memory devices are illustrated in FIGS. 2A-2B. For example, FIG. 2A illustrates a memory device 201A including floating gate charge storage structures 220A. In further detail, the memory device 201A can include alternating layers of dielectric material 240 and conductive material 250. The floating gate charge storage structures 220A can also reside between alternating layers of dielectric material 240. The conductive channel 210 can be adjacent to the floating gate charge storage structures 220A. The strain-inducing layer 212 can be adjacent to the conductive channel 210 on a side opposite the floating gate charge storage structures 220A. A tunnel dielectric layer 230 can reside between the conductive channel 210 and the alternating layers of conductive material 250 (and the floating gate charge storage structures 220A) and dielectric material 240. An insulating material core 214 can be located interior to the conductive channel 210 and the strain-inducing layer 212 can be positioned between the conductive channel 210 and the insulating material core 214. Blocking layers 222 can be positioned to electrically isolate individual floating gate charge storage structures 220A. It is noted that the tunnel dielectric layer 230, the conductive channel 210, and the strain-inducing layer 212 can form respective cylinders, or other similar structures, around the insulating material core 214. The floating gate charge storage structures 220A and the blocking layers 222 can also have cylindrical shapes, or other similar shapes. It is also noted that, while not expressly illustrated in FIG. 2A, an oxide layer (See FIG. 1A, 116) can also be included between the conductive channel 210 and the strain-inducing layer 212. It is further noted that the conductive channel 210 is at an angle (i.e. not parallel) relative to the alternating layers of dielectric material 240 and conductive material 250. In some examples, the conductive channel 210 can be substantially perpendicular to the alternating layers of dielectric material 240 and conductive material 250, although this is not required.

The alternating layers of conductive material 250 can generally form individual control gates. The alternating layers of conductive material or control gates can include a variety of conductive materials. Non-limiting examples can include polysilicon, tungsten, tungsten nitride, nickel, aluminum, tantalum nitride, platinum, gold, titanium, titanium nitride, titanium silicon nitride, titanium aluminum nitride, molybdenum nitride, the like, or a combination thereof. In some specific examples, the alternating layers of conductive material or control gates can include polysilicon. In some additional specific examples, the alternating layers of conductive material or control gates can include tungsten. The other materials and features of FIG. 2A can generally be the same as described with respect to FIG. 1A.

An alternative embodiment of a memory device is disclosed in FIG. 2B. Specifically, memory device 201B can include a charge trap charge storage structure 220B. A conductive channel 210 can be positioned adjacent to the charge trap charge storage structure 220B. A strain-inducing layer 212 can be positioned adjacent to the conductive channel on a side opposite the charge trap charge storage structure 220B. An insulating material core 214 can be positioned interior to the conductive channel 210 and the strain-inducing layer 212 can be positioned between the insulating material core 214 and the conductive channel 210. A tunnel dielectric layer 230 can be positioned between the conductive channel 210 and the charge trap charge storage structure 220B. A blocking dielectric layer 222 can be positioned between the charge trap storage structure 220B and the alternating layers of conductive material 250. Again, while not expressly illustrated in FIG. 2B, an oxide layer (See FIG. 1B, 116) can be positioned between the conductive channel 210 and the strain-inducing layer 212. It is noted that the blocking layer 222, the charge trap 222B, the tunnel dielectric layer 230, the conductive channel 210, and the strain-inducing layer 212 can form cylinders, or other similar structures, about the insulating material core 214. It is further noted that the conductive channel 210 is at an angle (i.e. not parallel) relative to the alternating layers of dielectric material 240 and conductive material 250. In some examples, the conductive channel 210 can be substantially perpendicular to the alternating layers of dielectric material 240 and conductive material 250, although this is not required.

Thus, while the specific architecture of the memory device 201B is structurally distinct from the memory device 201A, the same general layers and material considerations can be present in both types of memory devices. However, the charge storage structures 220A (floating gate), 220B (charge trap) have a variety of differences, such as those described above. It is further noted that other flash memory architectures can also be employed in addition to those expressly illustrated in the present figures. Generally, any flash memory architecture for which a strain-inducing layer can be used to improve the channel carrier mobility and associated conductivity of the conductive channel is considered to be within the scope of the present disclosure.

Figure 3:
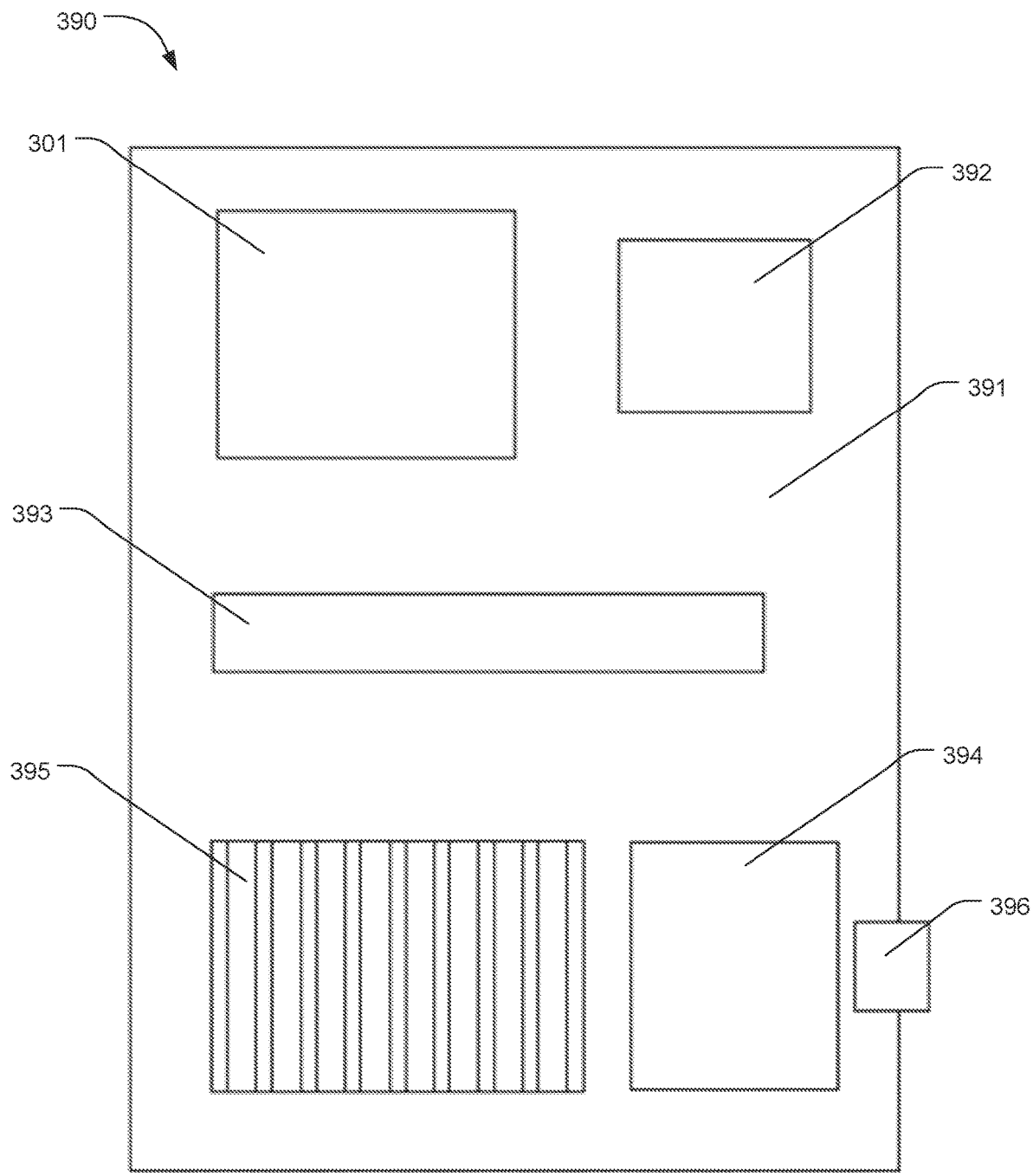
FIG. 3 illustrates a computing system, in accordance with an example embodiment.

In some examples, a memory device as described herein can be included in a computing system. In one aspect, as illustrated in FIG. 3, a computing system 390 can include a motherboard 391 and a memory device 301 (e.g. 201A, 201B, for example) as described herein that is operably coupled to the motherboard 391. In some additional examples, a computing system 390 can include a processor 392, a radio 394, a heat sink 395, a port 396, a slot 393, an additional memory device (not shown), or any other suitable device or component, which can be operably coupled to the motherboard 391. The computing system 390 can comprise any type of computing system, such as a desktop computer, a laptop computer, a tablet computer, a smartphone, a wearable device, a server (e.g. a local data storage server, a cloud storage server, or the like), etc. Other embodiments need not include all of the features specified in FIG. 3, and may include alternative features not specified in FIG. 3.

Circuitry used in electronic components or devices (e.g. a die) of a memory device can include hardware, firmware, program code, executable code, computer instructions, and/or software. Electronic components and devices can include a non-transitory computer readable storage medium which can be a computer readable storage medium that does not include signal. In the case of program code execution on programmable computers, the computing systems recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

The present disclosure also describes methods of manufacturing memory devices. Generally, the methods can include forming alternating layers of conductive material and dielectric material, forming a conductive channel through the alternating layers, forming a charge storage structure between the layers of conductive material and the conductive channel, and forming a strain-inducing layer adjacent to the conductive channel on a side opposite the charge storage structure.

Figure 4A:
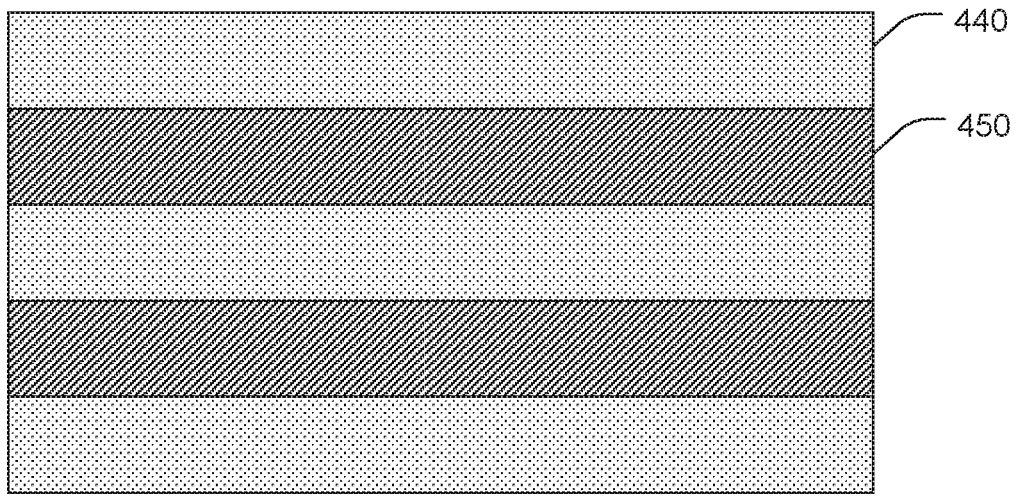
FIGS. 4A-4E illustrate a memory device at various stages of manufacturing, in accordance with an example embodiment.
Figure 4B:
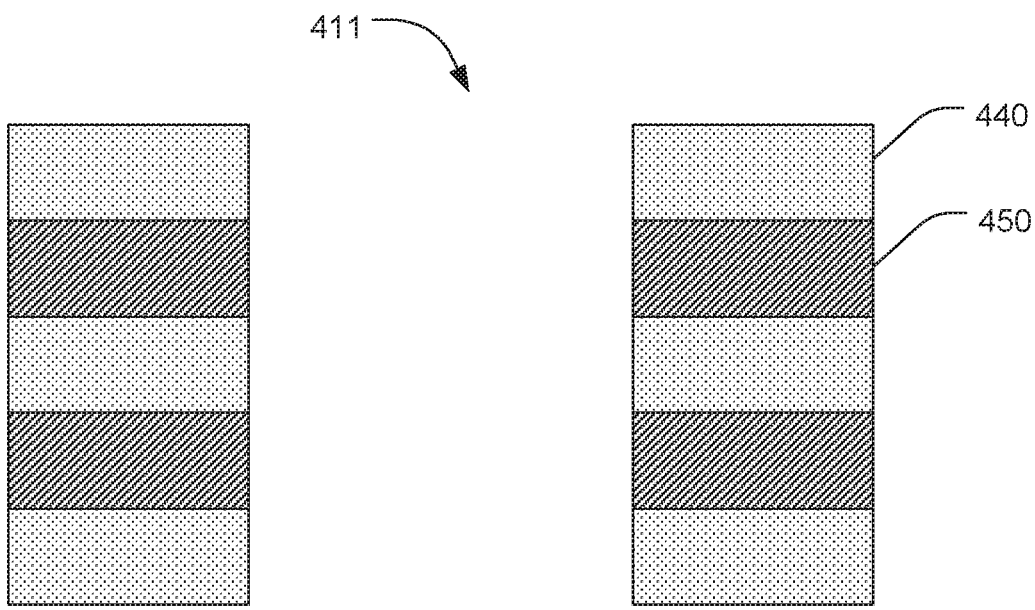
Figure 4C:
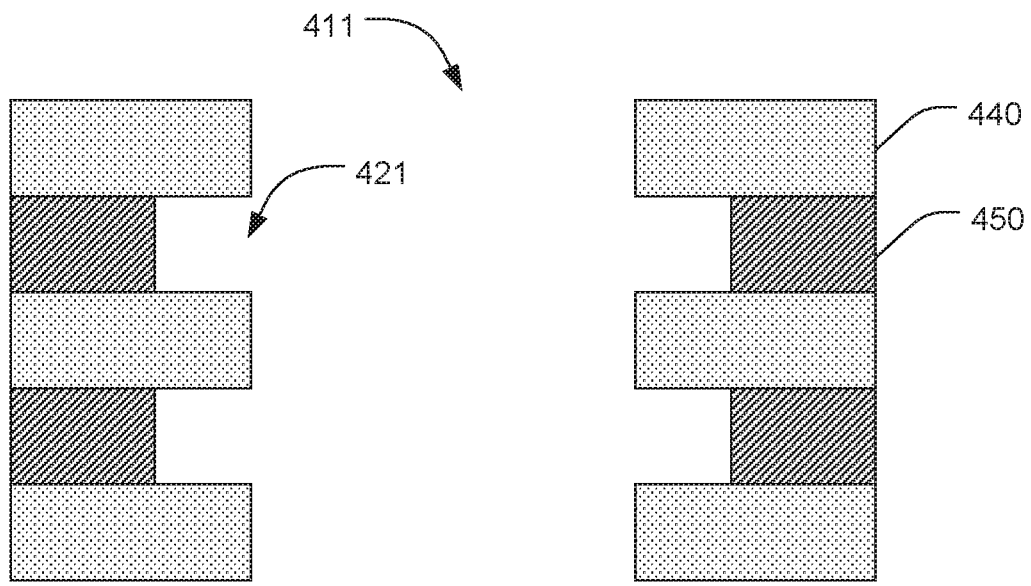

FIGS. 4A-4E illustrate an example of a method of manufacturing a memory device. Specifically, as illustrated in FIG. 4A, a plurality of alternating layers of dielectric material 440 and conductive material 450 can be formed to provide an initial stack. As illustrated in FIG. 4B, a pillar trench 411 can be formed through the stack of alternating layers 440, 450. The pillar trench 411 can be formed using a wet etching process, a dry etching process, or a combination thereof. As illustrated in FIG. 4C, a plurality of floating gate recesses 421 can be formed in the layers of conductive material 450. The floating gate recesses 421 can be formed by any suitable etching process, such as a wet etching process, a dry etching process, or a combination thereof. Thus, the floating gate recesses are isolated from one another by the layers of dielectric material 440.

Figure 4D:
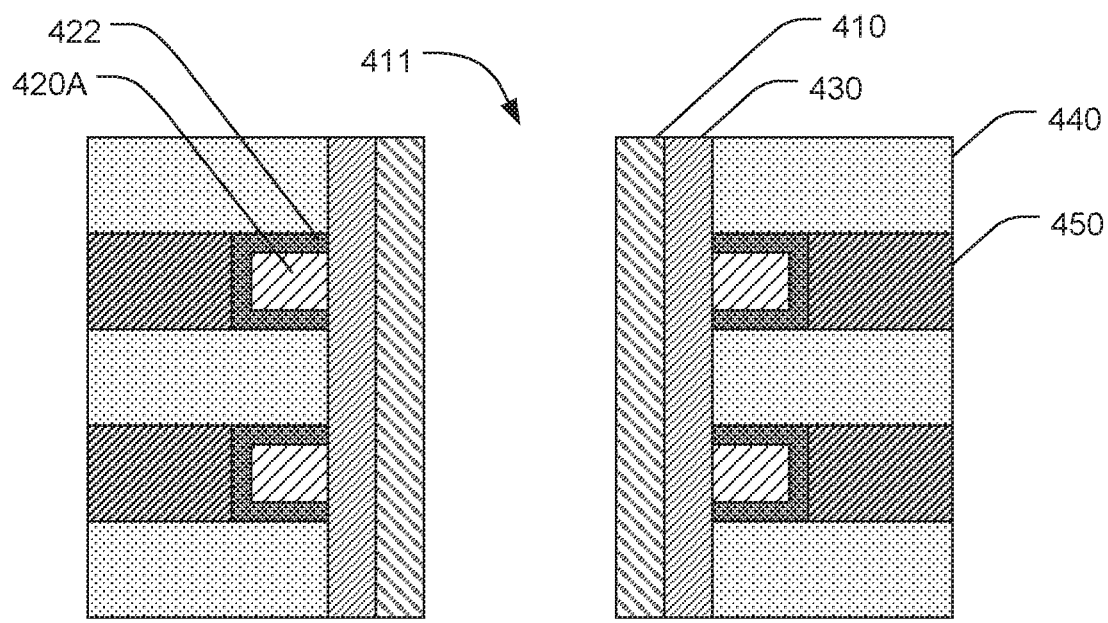

As illustrated in FIG. 4D, a blocking layer 422 can deposited within the floating gate recesses 421 to electrically isolate the charge storage structures 420A from adjacent conductive materials (e.g. conductive layers 450, for example, control gates). In some examples, the blocking layer 422 can be conformally deposited in the floating gate recesses 421. In some specific examples, the blocking layer 422 can be formed using chemical vapor deposition (CVD), physical vapor deposition (PVD), the like, or a combination thereof. The floating gate charge storage structures 420A can also be formed within the floating gate recesses 421. The floating gate charge storage structures 420A can be formed by CVD, PVD, the like, or a combination thereof. The tunnel dielectric layer 430 can be formed along the perimeter of the pillar trench 411 to electrically isolate the floating gate charge storage structures 420A from the conductive channel 410. The tunnel dielectric can be formed in a variety of ways. In one aspect the tunnel dielectric 430 can be an oxide (e.g. tunnel oxide) that has been treated to allow uniform growth on metal materials. In one specific aspect the tunnel dialectic 430 can be a DEP poly liner (30A) that has been in situ steam generation (ISSG) oxidized. A conductive channel 410 can be formed adjacent to the tunnel dielectric layer 430. The conductive channel 410 can be deposited, epitaxially grown, or otherwise formed within the pillar trench 411.

Figure 4E:
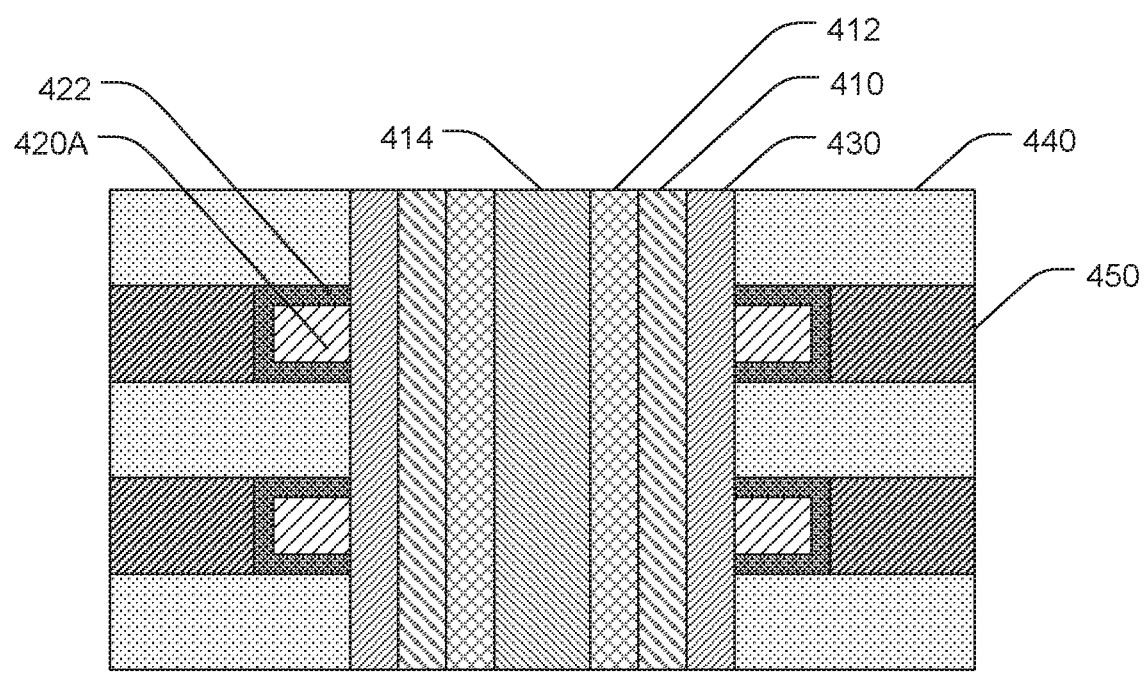

As disclosed in FIG. 4E, a strain-inducing layer 412 can be formed adjacent to the conductive channel 410. However, in some examples, an oxide layer (See FIG. 1A, 116) can also be formed between the strain-inducing layer 412 and the conductive channel 410. Where this is the case, the oxide layer can be deposited, grown, or otherwise formed between the strain-inducing layer 412 and the conductive channel 410. The strain-inducing layer 412 can be formed in a number of ways (e.g. CVD, PVD, etc.), depending on the type of material employed (e.g. inducing tensile strain due to thermal mismatch, or inducing tensile strain due to lattice mismatch).

As one non-limiting example, the strain-inducing layer 412 can include or be formed of a material having a CTE that is higher than the material of the conductive channel 410 so as to induce tensile strain via thermal mismatch between the strain-inducing layer 412 and the conductive channel 410. Where this is the case, it can be beneficial to reduce the hydrogen content of the strain-inducing layer 412. The temperature and deposition rate can affect hydrogen content of the strain-inducing layer 412 and whether the strain-inducing layer 412 induces beneficial tensile strain or detrimental compressive strain. In some examples, the strain-inducing layer 412 can be deposited at a temperature of at least 100° C. In some specific examples, the strain-inducing layer can be deposited at a temperature of from about 100° C. to about 800° C. In some further examples, the strain-inducing layer can be deposited at a temperature of from about 200° C. to about 400° C., from about 300° C. to about 500° C., or from about 600° C. to about 800° C. In one specific example, the strain-inducing layer can be deposited using low pressure CVD (LPCVD) at a temperature of from about 600° C. to about 800° C. and a low deposition rate. At these conditions, increased condensation reactions can occur during film growth that can result in low hydrogen content and higher tensile stress films. Further, LPCVD can allow for conformal deposition of the strain-inducing layer 412 in high aspect ratio structures, which can be valuable in achieving a uniformly stressed conductive channel 410.

In other examples, the strain-including layer 412 can include or be formed of a material having a higher lattice constant than the material of the conductive channel 410. Where this is the case, the strain-inducing layer 412 can be conformally deposited over an amorphous conductive channel material. This can be accomplished using LPCVD or other suitable process. The stack can then be subjected to a first annealing process to crystallize the strain-inducing layer 412. A second annealing process can then be employed to crystallize the material of the conductive channel 410 to induce lattice mismatch stress in the conductive channel 410. As one illustrative example, SiGe can be conformally deposited over amorphous silicon. The first annealing process can be performed at a temperature of from about 500° C. to about 550° C. to crystallize the SiGe. The second annealing process can then be performed at a temperature of about 600° C. to about 700° C. to crystallize the Si and induce a lattice mismatch between the Si conductive channel 410 and the SiGe strain-inducing layer 412.

An insulative material core 414 can be deposited interior to the conductive channel 410 and the strain-inducing layer 412 can be positioned between the conductive channel 410 and the insulative material core 414. The insulative material core can be formed using CVD, PVD, the like, or a combination thereof.

Figure 5A:
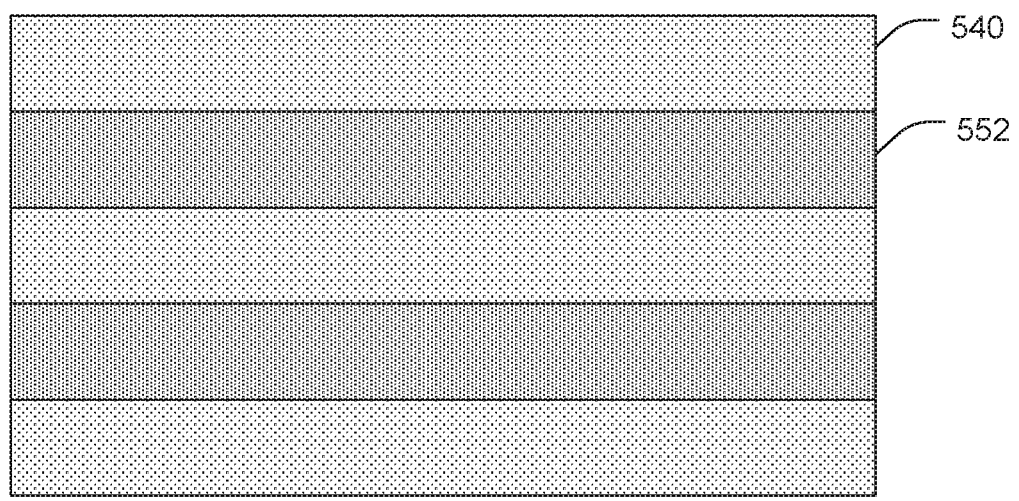
FIGS. 5A-5E illustrate a memory device at various stages of manufacturing, in accordance with an example embodiment.
Figure 5B:
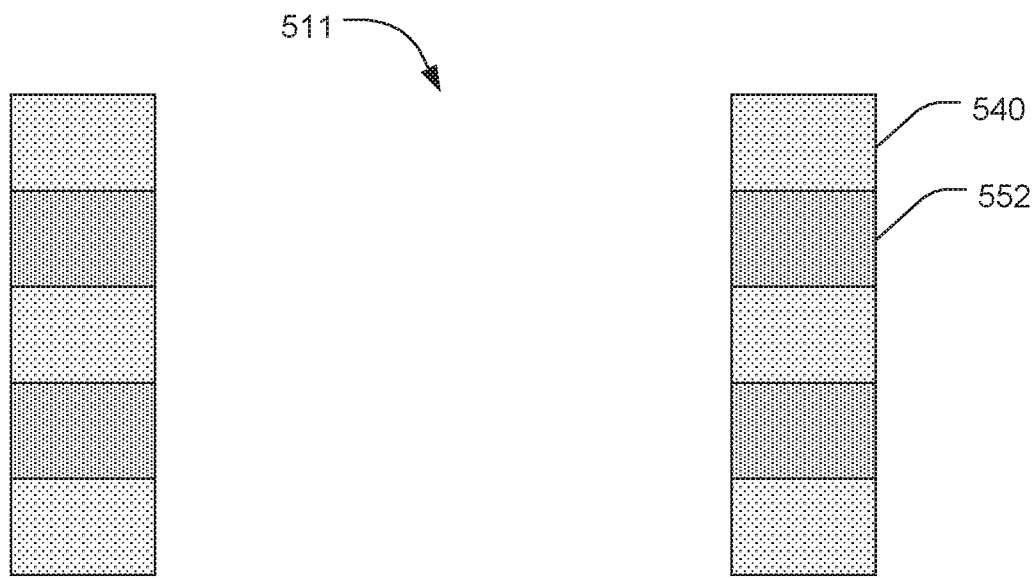

An alternative embodiment of a method of manufacturing a memory device is illustrated in FIGS. 5A-5E. As illustrated in FIG. 5A, alternating layers of dielectric material 540 and sacrificial material 552 can be formed to prepare an initial stack. The sacrificial material can include any material that can be selectively removed without substantially affecting the alternating layers of dielectric material 540. In some specific examples, the sacrificial material can be silicon nitride. As illustrated in FIG. 5B, a pillar trench 511 can be formed through the alternating layers of dielectric material 540 and sacrificial material 552.

Figure 5C:
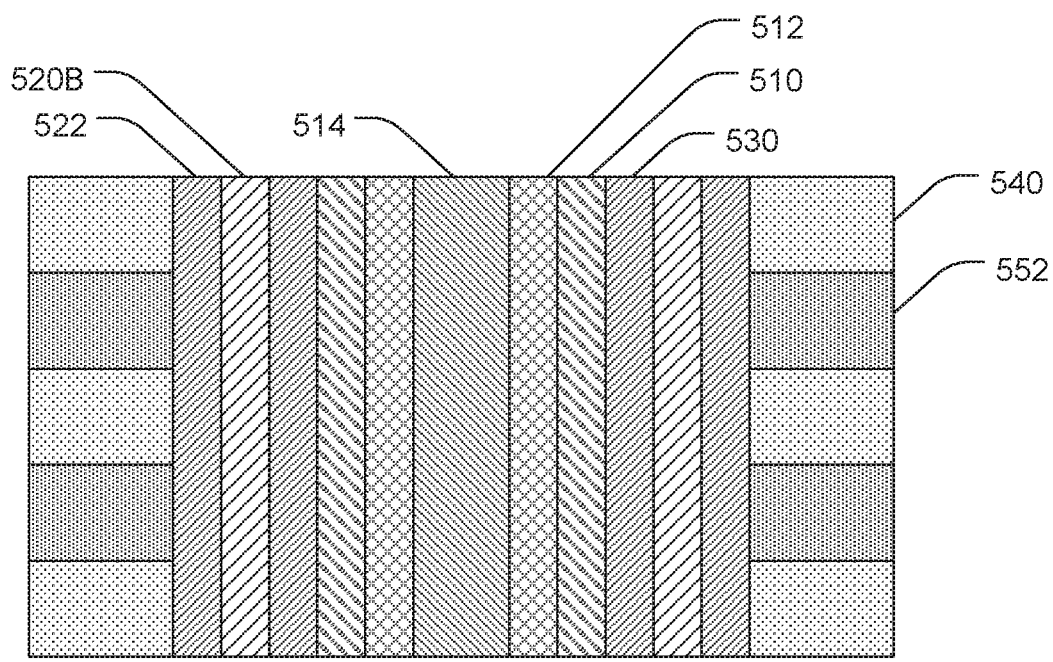

As depicted in FIG. 5C, a blocking layer 522 can be formed along a perimeter of the pillar trench 511. The blocking layer 522 can be formed using CVD, PVD, the like, or a combination thereof. A charge trap charge storage layer 520B can be formed adjacent to the blocking layer 522. The charge trap charge storage layer 520B can be formed using CVD, PVD, the like, or a combination thereof. A tunnel dielectric layer 530 can be formed adjacent to the charge trap charge storage layer 520B. The tunnel dielectric layer 530 can be formed using CVD, PVD, the like, or a combination thereof. A conductive channel 510 can be formed adjacent to the tunnel dielectric layer 530. The conductive channel 510 can be formed by deposition, epitaxial growth, the like, or a combination thereof.

A strain-inducing layer 512 can be formed adjacent to the conductive channel 510. However, in some examples, an oxide layer (See FIG. 1B, 116) can also be formed between the strain-inducing layer 512 and the conductive channel 510. Where this is the case, the oxide layer can be deposited, grown, or otherwise formed between the strain-inducing layer 512 and the conductive channel 510. The strain-inducing layer 512 can be formed in a number of ways (e.g. PVD, CVD, etc.), depending on the type of material employed (e.g. inducing tensile strain due to thermal mismatch, or inducing tensile strain due to lattice mismatch).

As one non-limiting example, the strain-inducing layer 512 can include or be formed of a material having a CTE that is higher than the material of the conductive channel 510 so as to induce tensile strain via thermal mismatch between the strain-inducing layer 512 and the conductive channel 510. Where this is the case, it can be beneficial to reduce the hydrogen content of the strain-inducing layer 512. The temperature and deposition rate can affect hydrogen content of the strain-inducing layer 512 and whether the strain-inducing layer 512 induces beneficial tensile strain or detrimental compressive strain. In some examples, the strain-inducing layer 512 can be deposited at a temperature of at least 100° C. In some specific examples, the strain-inducing layer can be deposited at a temperature of from about 100° C. to about 800° C. In some further examples, the strain-inducing layer can be deposited at a temperature of from about 200° C. to about 400° C., from about 300° C. to about 500° C., or from about 600° C. to about 800° C. In one specific example, the strain-inducing layer can be deposited using low pressure CVD (LPCVD) at a temperature of from about 600° C. to about 800° C. and a low deposition rate. At these conditions, increased condensation reactions can occur during film growth that can result in low hydrogen content and higher tensile stress films. Further, LPCVD can allow for conformal deposition of the strain-inducing layer 512 in high aspect ratio structures, which can be valuable in achieving a uniformly stressed conductive channel 510.

In other examples, the strain-including layer 512 can include or be formed of a material having a higher lattice constant than the material of the conductive channel 510. Where this is the case, the strain-inducing layer 512 can be conformally deposited over an amorphous conductive channel material. This can be accomplished using LPCVD or other suitable process. The stack can then be subjected to a first annealing process to crystallize the strain-inducing layer 512. A second annealing process can then be employed to crystallize the material of the conductive channel 510 to induce lattice mismatch stress in the conductive channel 510. As one illustrative example, SiGe can be conformally deposited over amorphous silicon. The first annealing process can be performed at a temperature of from about 500° C. to about 550° C. to crystallize the SiGe. The second annealing process can then be performed at a temperature of about 600° C. to about 700° C. to crystallize the Si and induce a lattice mismatch between the Si conductive channel 510 and the SiGe strain-inducing layer 512.

An insulative material core 514 can be deposited interior to the conductive channel 510 and the strain-inducing layer 512 can be positioned between the conductive channel 510 and the insulative material core 514. The insulative material core can be formed using CVD, PVD, the like, or a combination thereof.

Figure 5D:
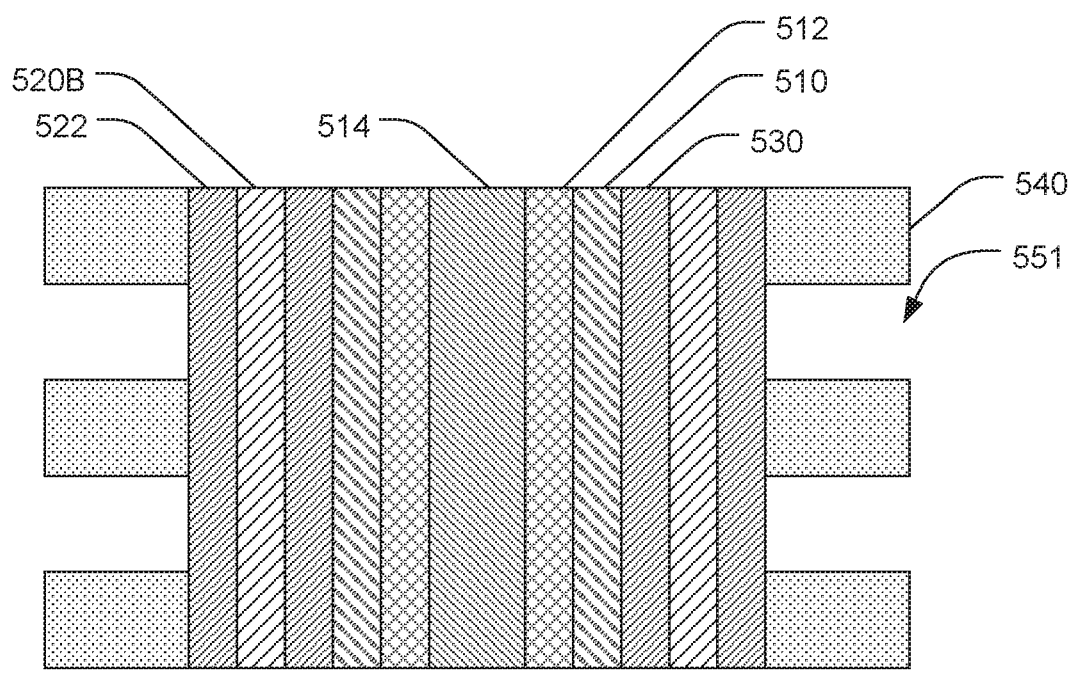
Figure 5E:
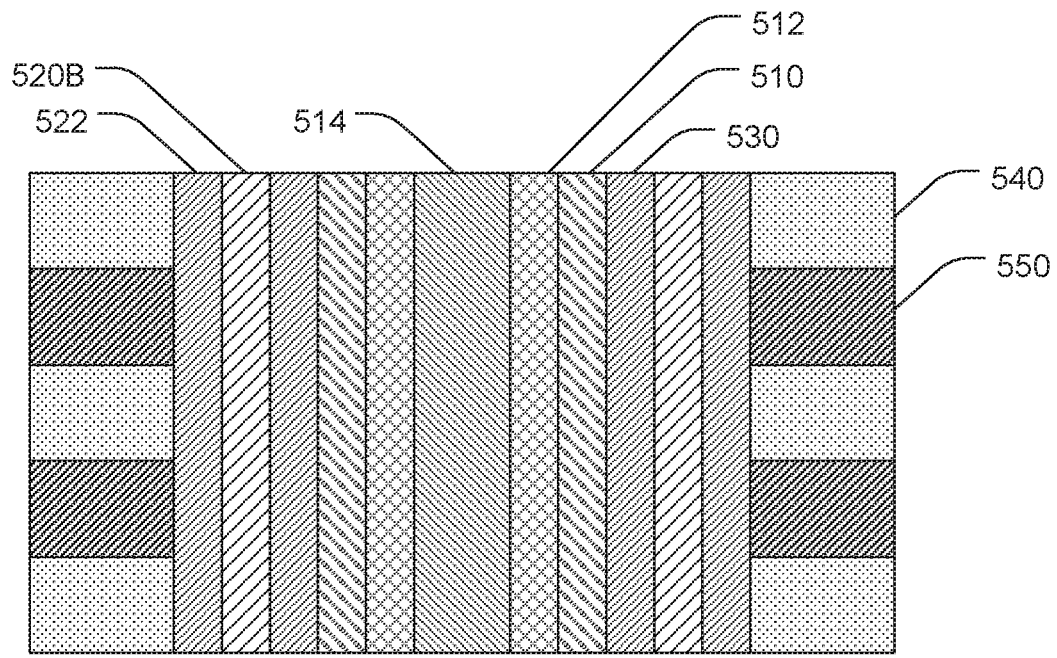

As illustrated in FIG. 5D, sacrificial material can be removed to provide conductive material or control gate recesses 551. The sacrificial material can be removed using a wet etching process, a dry etching process, the like, or a combination thereof. As illustrated in FIG. 5E, the control gate recesses can be filled with conductive material to form alternating layers of dielectric material 540 and conductive material 550. The layers of conductive material 550 can generally form individual control gates. In some specific examples, the conductive material can include tungsten.

EXAMPLES

In one example, there is provided a memory structure, comprising a conductive channel, a charge storage structure adjacent to the conductive channel, and a strain-inducing layer adjacent to the conductive channel on a side opposite the charge storage structure, wherein the strain-inducing layer has a higher coefficient of thermal expansion (CTE) than the conductive channel.

In one example of a memory structure, the conductive channel comprises a doped polysilicon material.

In one example of a memory structure, the conductive channel is P-type doped.

In one example of a memory structure, the conductive channel is N-type doped.

In one example of a memory structure, the charge storage structure comprises a floating gate memory structure.

In one example of a memory structure, the floating gate memory structure comprises polysilicon.

In one example of a memory structure, the charge storage structure comprises a charge trap memory structure.

In one example of a memory structure, the charge trap memory structure comprises silicon nitride.

In one example of a memory structure, the strain-inducing layer comprises a dielectric material.

In one example of a memory structure, the dielectric material comprises silicon nitride, doped silicon nitride, doped silicon, silicon germanium, or a combination thereof.

In one example of a memory structure, the strain-inducing layer has a thickness of from about 5 nm to about 20 nm.

In one example of a memory structure, the strain-inducing layer has a coefficient of thermal expansion of from about $0.5 \times 10^{-6}/°$ C. to about $5.0 \times 10^{-6}/°$ C.

In one example of a memory structure, the difference in coefficient of thermal expansion between the conductive channel and the strain-inducing layer is at least about $0.5 \times 10^{-6}/°$ C.

In one example of a memory structure, the memory structure further comprises an oxide layer between the conductive channel and the strain-inducing layer.

In one example of a memory structure, the oxide layer has a thickness of from about 0.5 nm to about 1.5 nm.

In one example of a memory structure, the memory structure further comprises an insulating material core, wherein the conductive channel is external to the insulating material core.

In one example of a memory structure, the strain-inducing layer is positioned between the conductive channel and the insulating material core.

In one example of a memory structure, the insulating material core comprises silicon oxide, silicon oxynitride, silicon oxycarbide, spin-on-glass, organic polymer, organic/inorganic co-polymer, or other combination thereof.

In one example of a memory structure, the strain-inducing layer and the insulating material core comprise different dielectric materials.

In one example, there is provided memory device, comprising alternating layers of conductive material and dielectric material, a conductive channel at an angle to the alternating layers, a charge storage structure between the layers of conductive material and the conductive channel, and a strain-inducing layer adjacent to the conductive channel on a side opposite the charge storage structure, wherein the strain inducing layer has a higher coefficient of thermal expansion (CTE) than the conductive channel.

In one example of a memory device, the alternating layers of conductive material comprise polysilicon, tungsten, tungsten nitride, nickel, aluminum, tantalum nitride, platinum, gold, titanium, titanium nitride, titanium silicon nitride, titanium aluminum nitride, molybdenum nitride, or a combination thereof.

In one example of a memory device, the alternating layers of dielectric material comprise silicon oxide, silicon nitride, silicon oxynitride, silicon oxycarbide, spin-on-glass, organic polymer, organic/inorganic co-polymer, or other combination thereof.

In one example of a memory device, the conductive channel comprises a doped polysilicon material.

In one example of a memory device, the conductive channel is P-type doped.

In one example of a memory device, the conductive channel is N-type doped.

In one example of a memory device, the conductive channel is at an angle that is substantially perpendicular to the alternating layers of conductive material and dielectric material.

In one example of a memory device, the charge storage structure comprises a floating gate memory structure.

In one example of a memory device, the floating gate memory structure comprises polysilicon.

In one example of a memory device, the charge storage structure comprises a charge trap memory structure.

In one example of a memory device, the charge trap memory structure comprises silicon nitride.

In one example of a memory device, the strain-inducing layer comprises a dielectric material.

In one example of a memory device, the dielectric material comprises silicon nitride, doped silicon nitride, doped silicon, silicon germanium, or a combination thereof.

In one example of a memory device, the strain-inducing layer has a thickness of from about 5 nm to about 20 nm.

In one example of a memory device, the strain-inducing layer has a coefficient of thermal expansion of from about $0.5 \times 10^{-6}/°$ C. to about $5.0 \times 10^{-6}/°$ C.

In one example of a memory device, the difference in coefficient of thermal expansion between the conductive channel and the strain-inducing layer is at least about $0.5 \times 10^{-6}/°$ C.

In one example of a memory device, the memory device further comprises an oxide layer between the conductive channel and the strain-inducing layer.

In one example of a memory device, the oxide layer has a thickness of from about 0.5 nm to about 1.5 nm.

In one example of a memory device, the memory device further comprises an insulating material core, wherein the conductive channel is external to the insulating material core.

In one example of a memory device, the strain-inducing layer is positioned between the conductive channel and the insulating material core.

In one example of a memory device, the insulating material core comprises silicon oxide, silicon oxynitride, silicon oxycarbide, spin-on-glass, organic polymer, organic/inorganic co-polymer, or other combination thereof.

In one example of a memory device, the strain-inducing layer and the insulating material core comprise different dielectric materials.

In one example, there is provided a computing system, comprising a motherboard and a memory device as described herein operatively coupled to the motherboard.

In one example of a computing system, the computing system comprises a desktop computer, a laptop computer, a tablet, a smartphone, a wearable device, a server, or a combination thereof.

In one example of a computing system, the computing system further comprises a processor, a memory device, a heat sink, a radio, a slot, a port, or a combination thereof operably coupled to the motherboard.

In one example, there is provided a method of manufacturing a memory device, comprising forming alternating layers of conductive material and dielectric material, forming a conductive channel through the alternating layers, forming a charge storage structure between the layers of conductive material and the conductive channel, and forming a strain-inducing layer adjacent to the conductive channel on a side opposite the charge storage structure, wherein the strain inducing layer has a higher coefficient of thermal expansion (CTE) than the conductive channel.

In one example of a method of manufacturing, the method further comprises forming alternating layers of dielectric material and sacrificial material prior to forming alternating layers of conductive material and dielectric material.

In one example of a method of manufacturing, forming alternating layers of conductive material and dielectric material comprises removing the sacrificial material layers and forming conductive material layers between dielectric material layers.

In one example of a method of manufacturing, the conductive channel is formed at an angle that is substantially perpendicular to the alternating layers of conductive material and dielectric material.

In one example of a method of manufacturing, forming the charge storage structure comprises forming a charge trap memory structure between the layers of conductive material and the conductive channel.

In one example of a method of manufacturing, forming the charge storage structure comprises forming a floating gate memory structure between the layers of conductive material and the conductive channel and between individual layers of dielectric material.

In one example of a method of manufacturing, the method further comprises forming a blocking dielectric layer between individual layers of conductive material and individual floating gate memory structures.

In one example of a method of manufacturing, the method further comprises forming the strain-inducing layer interior to the conductive channel.

In one example of a method of manufacturing, forming the strain-inducing layer comprises depositing a strain-inducing material at a temperature of at least 200° C.

In one example of a method of manufacturing, forming the strain-inducing layer comprises depositing a strain-inducing material at a temperature of from about 220° C. to about 350° C.

In one example of a method of manufacturing, the method further comprises forming an oxide layer between the conductive channel and the strain-inducing layer.

In one example of a method of manufacturing, the method further comprises forming an insulative material core interior to the conductive channel.

In one example of a method of manufacturing, the strain-inducing layer is between the insulative material core and the conductive channel.

In one example, there is provided a pillar for use in a memory structure, the pillar comprising an insulating material core, a conductive channel external to the insulating material core, and a strain-inducing layer between the insulating material core and the conductive channel, wherein the strain inducing layer has a higher coefficient of thermal expansion (CTE) than the conductive channel.

In one example of a pillar, the conductive channel comprises a doped polysilicon material.

In one example of a pillar, the conductive channel is P-type doped.

In one example of a pillar, the conductive channel is N-type doped.

In one example of a pillar, the strain-inducing layer is between the conductive channel and the insulating material core.

In one example of a pillar, the strain-inducing layer comprises a dielectric material.

In one example of a pillar, the dielectric material comprises silicon nitride, doped silicon nitride, doped silicon, silicon germanium, or a combination thereof.

In one example of a pillar, the strain-inducing layer has a thickness of from about 5 nanometers (nm) to about 20 nm.

In one example of a pillar, the strain-inducing layer has a coefficient of thermal expansion of from about $0.5 \times 10^{-6}$/° C. to about $5.0 \times 10^{-6}$/° C.

In one example of a pillar, the difference in coefficient of thermal expansion between the conductive channel and the strain-inducing layer is at least about $0.5 \times 10^{-6}$/° C.

In one example of a pillar, the pillar further comprises an oxide layer between the conductive channel and the strain-inducing layer.

In one example of the pillar, the oxide layer has a thickness of from about 0.5 nm to about 1.5 nm.

In one example of a pillar, the insulating material core comprises silicon oxide, silicon oxynitride, silicon oxycarbide, spin-on-glass, organic polymer, organic/inorganic co-polymer, or other combination thereof.

In one example of a pillar, the strain-inducing layer and the insulating material core comprise different dielectric materials.

In one example of a pillar, the pillar further comprises a charge storage structure adjacent the conductive channel.

In one example of a pillar, the charge storage structure is a charge trap storage structure.

In one example of a pillar, the charge storage structure is a floating gate storage structure.

In one example of a pillar, the pillar further comprises a dielectric material layer between the charge storage structure and the conductive channel.

In one example, there is provided another memory structure, comprising a conductive channel, a charge storage structure adjacent to the conductive channel, and a strain-inducing layer adjacent to the conductive channel on a side opposite the charge storage structure, wherein the strain-inducing layer comprises silicon nitride, doped silicon nitride, doped silicon, silicon germanium, or a combination thereof.

In one example of the memory structure, the conductive channel comprises a doped polysilicon material.

In one example of the memory structure, the conductive channel is P-type doped.

In one example of the memory structure, the conductive channel is N-type doped.

In one example of the memory structure, the charge storage structure comprises a floating gate memory structure.

In one example of the memory structure, the floating gate memory structure comprises polysilicon.

In one example of the memory structure, the charge storage structure comprises a charge trap memory structure.

In one example of the memory structure, the charge trap memory structure comprises silicon nitride.

In one example of the memory structure, the strain-inducing layer comprises $Si_xN_{(1-x)}$, where x is from about 0.3 to about 0.7.

In one example of the memory structure, the strain-inducing layer comprises a dopant in an amount of from about 1 wt % to about 25 wt %.

In one example of the memory structure, the strain-inducing layer is doped with carbon in an amount of from about 1 wt % to about 5 wt %.

In one example of the memory structure, the strain-inducing layer is doped with oxygen in an amount of from about 5 wt % to about 20 wt %.

In one example of the memory structure, the strain-inducing layer has a higher coefficient of thermal expansion (CTE) than the conductive channel.

In one example of the memory structure, the strain-inducing layer has a CTE of from about $0.5 \times 10^{-6}/°$ C. to about $4.0 \times 10^{-6}/°$ C.

In one example of the memory structure, the difference in CTE between the conductive channel and the strain-inducing layer is at least about $0.5 \times 10^{-6}/°$ C.

In one example of the memory structure, the strain-inducing layer has a higher lattice constant than the conductive channel.

In one example of the memory structure, the strain-inducing layer has a thickness of from about 5 nm to about 20 nm.

In one example of the memory structure, the memory structure further comprises an oxide layer between the conductive channel and the strain-inducing layer.

In one example of the memory structure, the oxide layer has a thickness of from about 0.5 nm to about 1.5 nm.

In one example of the memory structure, the memory structure further comprises an insulating material core, wherein the conductive channel is external to the insulating material core.

In one example of the memory structure, the strain-inducing layer is positioned between the conductive channel and the insulating material core.

In one example of the memory structure, the insulating material core comprises silicon oxide, silicon oxynitride, silicon oxycarbide, spin-on-glass, organic polymer, organic/inorganic co-polymer, or other combination thereof.

In one example of the memory structure, the strain-inducing layer and the insulating material core comprise different dielectric materials.

While the forgoing examples are illustrative of the principles of technology embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A memory structure, comprising:
    a conductive channel;
    a charge storage structure adjacent to the conductive channel; and
    a strain-inducing layer adjacent to the conductive channel on a side opposite the charge storage structure, wherein the strain-inducing layer comprises at least one selected from a group consisting of silicon nitride, doped silicon nitride, doped silicon, silicon germanium, or a combination thereof;
    wherein the strain-inducing layer comprises a dopant in an amount of from about 1 wt % to about 25 wt %;
    wherein the strain-inducing layer is doped with oxygen in an amount of from about 5 wt % to about 20 wt %.

2. The memory structure of claim 1, wherein the conductive channel comprises a doped polysilicon material.

3. The memory structure of claim 2, wherein the conductive channel is P-type doped.

4. The memory structure of claim 2, wherein the conductive channel is N-type doped.

5. The memory structure of claim 1, wherein the charge storage structure comprises a floating gate memory structure.

6. The memory structure of claim 5, wherein the floating gate memory structure comprises polysilicon.

7. The memory structure of claim 1, wherein the charge storage structure comprises a charge trap memory structure.

8. The memory structure of claim 7, wherein the charge trap memory structure comprises silicon nitride.

9. The memory structure of claim 1, wherein the strain-inducing layer comprises $Si_xN_{(1-x)}$, where x is from about 0.3 to about 0.7.

10. The memory structure of claim 1, wherein the strain-inducing layer is doped with carbon in an amount of from about 1 wt % to about 5 wt %.

11. The memory structure of claim 1, wherein the strain-inducing layer has a higher coefficient of thermal expansion (CTE) than the conductive channel.

12. The memory structure of claim 11, wherein the strain-inducing layer has a CTE of from about $0.5 \times 10^{-6}/°$ C. to about $4.0 \times 10^{-6}/°$ C.

13. The memory structure of claim 11, wherein the difference in CTE between the conductive channel and the strain-inducing layer is at least about $0.5 \times 10^{-6}/°$ C.

14. The memory structure of claim 1, wherein the strain-inducing layer has a higher lattice constant than the conductive channel.

15. The memory structure of claim 1, wherein the strain-inducing layer has a thickness of from about 5 nm to about 20 nm.

16. The memory structure of claim 1, further comprising an oxide layer between the conductive channel and the strain-inducing layer.

17. The memory structure of claim 16, wherein the oxide layer has a thickness of from about 0.5 nm to about 1.5 nm.

18. The memory structure of claim 1, further comprising an insulating material core, wherein the conductive channel is external to the insulating material core.

19. The memory structure of claim 18, where the strain-inducing layer is positioned between the conductive channel and the insulating material core.

20. The memory structure of claim 18, wherein the insulating material core comprises silicon oxide, silicon oxynitride, silicon oxycarbide, spin-on-glass, organic polymer, organic/inorganic co-polymer, or other combination thereof.

21. The memory structure of claim 18, wherein the strain-inducing layer and the insulating material core comprise different dielectric materials.

* * * * *